United States Patent
Heflinger

(10) Patent No.: US 6,175,320 B1
(45) Date of Patent: Jan. 16, 2001

(54) ALL OPTICAL ANALOG-TO-DIGITAL CONVERTER EMPLOYING AN IMPROVED STABILIZED OPTICAL INTERFEROMETER

(75) Inventor: Donald G. Heflinger, Torrance, CA (US)

(73) Assignee: TRW Inc., Redondo Beach, CA (US)

( * ) Notice: Under 35 U.S.C. 154(b), the term of this patent shall be extended for 0 days.

(21) Appl. No.: 09/336,317

(22) Filed: Jun. 18, 1999

(51) Int. Cl.[7] ............... H03M 1/20; H03M 1/00; H04J 4/00; H04B 10/04

(52) U.S. Cl. ............... 341/137; 341/131; 359/121; 359/123; 359/184; 359/185; 359/124; 359/181; 385/24; 385/37; 385/40

(58) Field of Search ............... 341/131, 137, 341/111; 359/121, 123, 124, 125, 181, 184, 188; 385/24, 37, 40

(56) References Cited

U.S. PATENT DOCUMENTS

| | | | |
|---|---|---|---|
| 4,947,170 | * 8/1990 | Falk | 341/137 |
| 5,265,039 | * 11/1993 | Curbelo et al. | 364/574 |
| 5,381,147 | * 1/1995 | Birkmayer | 341/137 |
| 5,889,901 | * 3/1999 | Anderson et al. | 385/12 |
| 5,970,185 | * 10/1999 | Baker et al. | 385/3 |
| 6,008,748 | * 12/1999 | Sterzer | 341/155 |
| 6,100,831 | * 8/2000 | Frankel | 341/137 |

OTHER PUBLICATIONS

Eric A. Swanson, Jeffrey C. Livas, and Roy S. Bondurant, "High Sensitivity Optically Preamplified Direct Detection DPSK Receiver With Active Delay–Line Stabilization", IEEE Photonics Technology Letters, vol. 6, No. 2, Feb. 1994, pp. 263–265.

* cited by examiner

*Primary Examiner*—Howard L. Williams
*Assistant Examiner*—Vibol Tan
(74) *Attorney, Agent, or Firm*—Michael S. Yatsko; Robert W. Keller

(57) ABSTRACT

An apparatus for stabilizing optical interferometers utilized in an all analog to digital converter using an additional optical signal that differs in wavelength by a factor of two from the wavelength used for the analog to digital conversion is disclosed. The optical interferometers have an optical path length that is tunable. They develop a first interference pattern from the additional optical signal when the optical path length is a prescribed value. The interferometers develop a second interference pattern from the additional optical signal when the optical path length is not the prescribed value. Optoelectronic detectors are responsive to the optical interference pattern generated by the additional optical signal and develop electronic feedback signals when the first interference patterns are not present. Accordingly, feedback circuits produce the optical path length adjustment drive signals, which serve to change the optical path lengths until each interferometer reaches the prescribed value, thereby tuning the optical interferometers. Each tuned interferometer then generates the appropriate optical output from the original optical signal that is made to very in wavelength in accordance to the amplitude of an analog signal so as to produce the appropriate data bit in a corresponding digital word.

16 Claims, 3 Drawing Sheets

ALL OPTICAL ANALOG-TO-DIGITAL CONVERTER EMPLOYING AN IMPROVED STABILIZED OPTICAL INTERFEROMETER

CROSS-REFERENCE TO RELATED APPLICATIONS

This application is related to four commonly assigned applications entitled: "Apparatus And Method Employing An Additional Optical Signal For Stabilizing An Optical Interferometer", TRW Docket No. 11-0976, having inventor Donald Heflinger, filed concurrently with this application, Ser. No. 09/336,248; "Apparatus And Method For Tuning An Optical Interferometer", TRW Docket No. 11-0975, having inventors Donald Heflinger, Jeffrey Bauch and Todd Humes, filed on Jan. 26, 1999, Ser. No. 09/236,981; "All Optical Analog To Digital Converter", TRW Docket No. 11-0918, having inventor Donald Heflinger; filed on Jun. 17, 1998, Ser. No. 09/089,844; and "Active Multimode Optical Signal Splitter", TRW Docket No. 11-0837, having inventor Charles Zmudzinski, filed on May 30, 1997, Ser. No. 08/866,656.

BACKGROUND OF THE INVENTION

1. Field of the Invention

The present invention generally relates to an all optical analog-to-digital converter, and more particularly to such an apparatus that employs an optical interferometer that uses two optical signals that differ in wavelength by a factor of two.

2. Description of the Prior Art

It is often desirable to convert an analog amplitude varying signal to a digital set of values which corresponds to various voltages in the analog waveform to generate a corresponding digital signal. Conventional approaches generally rely on iterative and/or comparative techniques for determining a digital signal based on an analog waveform voltage. In particular, a common conventional approach compares the actual voltage of the analog amplitude varying signal to a comparison voltage which is generated from a digital word. Various digital words are utilized to create comparison voltages which are then rapidly compared to the actual voltage to determine whether the comparison voltages are greater or less than, in an instant of time, the analog amplitude varying signal. Through a continuous iterative comparison process, a digital word which corresponds to the actual voltage of the analog amplitude varying signal is generated. The digital word is recorded for that instant of time and the same iterative and/or comparative process is repeated for subsequent instants of time corresponding to the analog signal. This conventional approach is limited in speed by the iterative comparison process.

An approach for performing analog-to-digital conversion that eliminates this time consuming iterative comparison process is described in U.S. patent application Ser. No. 09/089,844, filed Jun. 17, 1998, entitled "All Optical Analog-To-Digital Converter", and assigned to the same Assignee as the present invention. In this approach, an analog signal is converted to an optical signal that varies in wavelength in accordance with the amplitude of the analog signal. This optical signal is then analyzed in parallel by an array of optical interferometers that have optical path length differences that correspond to the weighting factor of each digital bit in the digital word that is used to represent the analog voltage at a particular instant in time. The individual optical interferometers simultaneously deliver, via interference the appropriate optical output from each of their two outputs so that the optical levels, when detected by photodetection, will generate, in parallel, the appropriate digital bits that make up the digital word that corresponds to the analog voltage at that particular instant in time.

The process for creating the appropriate state of interference in each of the optical interferometers requires that the optical path length difference in each optical interferometer be maintained to within a fraction of a wavelength of the light being interfered. Optical interferometers made using optical fiber or silica waveguide are not stable devices. They are particularly susceptible to uncontrollable conditions, such as temperature variations. As the temperature proximate the optical interferometer changes, the path length of the optical fibers or silica waveguide making up its legs likewise change. This results in a change in the interference pattern created by the optical interferometer. To compensate, the optical interferometer must be tuned continuously.

An apparatus and method for tuning an optical interferometer is known in the art. An example of such an apparatus is described in an article by Eric A. Swanson, Jeffrey C. Livas and Roy S. Bondurant, entitled "High Sensitivity Optically Preamplified Direct Detection DPSK Receiver With Active Delay-Line Stabilization," in IEEE Photonics Technology Letters, Vol. 6, No. 2, February 1994. This article describes an optical communication system that modulates digital information onto transmitted light using differential phase shift keying (DPSK) and then demodulates this information using an actively tuned unbalanced Mach-Zehnder optical interferometer that is tuned using an apparatus and a method known in the art. The unbalanced Mach-Zehnder optical interferometer has an additional optical path length in one leg that provides a propagation delay duration of one data bit. The imbalance in the Mach-Zehnder optical interferometer enables light in one data bit to be optically interfered with light in the data bit immediately following this data bit. The relative state of optical phase between these two DPSK data bits determines in which of the two output legs of the interferometer light is produced provided that the unbalanced Mach-Zehnder optical interferometer is properly tuned within a fraction of a wavelength of the light. Light produced from one leg constitutes digital "ones" while light produced in the other leg constitutes digital "zeros" in the transmitted digital information signal.

The apparatus described in the article includes a laser and a phase modulator for producing an optical DPSK signal at a preselected wavelength, a tunable unbalanced Mach-Zehnder optical interferometer, a dual balanced detector and a feedback electronic circuit coupling the signal developed across one detector of the balanced detector to one leg of the Mach-Zehnder interferometer. Two different approaches are described for tuning the optical path length in the unbalanced Mach-Zehnder optical interferometer. In the first approach, the interferometer is made of optical fiber and one leg of the interferometer is wrapped around a piezoelectric transducer (PZT) that enables an electronic signal to stretch the fiber, thereby increasing the optical path length. In the second approach, the interferometer comprises a silica integrated optical waveguide with an integral thermal heater that enables an electronic signal to increase the temperature of one leg of the interferometer, thereby increasing the optical path length. To tune the Mach-Zehnder interferometer a small electronic dither signal is applied to the actively tuned optical path length to provide a feedback signal for the electronic controller. This enables proper adjustment of the optical path length. Electronic synchronous detection techniques on this dither signal are used to provide the appropriate corrections to the optical path length, enabling the error in tuning to be below an acceptable level. This same tuning approach can be utilized to tune the optical interferometer in the all optical analog-to-digital converter, but there are some adverse consequences.

The prior art approaches for actively tuning an optical interferometer have several disadvantages. First, they introduce an undesired optical intensity dither on top of the original optical signal that is intended to be extracted. This dither arising from the intentional dither of the optical path length is actually a source of noise that degrades the fidelity of the original signal. In the case of the all optical analog-to-digital converter, this dither leads to significant errors in the determination of the digital word since each data bit in this word can be affected by the dither. Second, the approach using the heater to perform the dither and tuning is restricted to relatively low frequencies of dither due to the relatively large thermal time constant of the heater. Third, the approaches introduce a small dithering variation in the interference state delivered at the output of the Mach-Zehnder interferometer. This precludes the use of the interferometer in applications where an absolute quiet state of interference must be maintained such as is the case in the all optical analog-to-digital converter.

What is needed, therefore, is an improved all optical analog-to-digital converter that employs an improved optical interferometer tuning approach which utilizes an additional optical signal for tuning without introducing any dither in its optical path length.

SUMMARY OF THE INVENTION

The preceding and other shortcomings of the prior art are addressed and overcome by the present invention which provides generally, in a first aspect, an apparatus for converting an analog electrical signal into a digital electrical signal including a converter which converts the analog signal into an optical signal which varies in wavelength in accordance with the amplitude of the analog signal, a splitter which applies the optical signal over a preselected number of light paths and a plurality of optical interferometers, each connected to the light paths, each having an optical light path that is tunable, and using an additional optical signal to actively tune and stabilize the optical interferometers that have a wavelength that differs by a factor of two from the average wavelength of the light that varies in wavelength in accordance with the amplitude of the analog signal.

Briefly, the interferometers comprise a dithering signal generator, means for generating an additional optical signal having a wavelength that differs from the original wavelength on which the optical interferometer is to act by a multiple of two, means for applying the dithering signal to the additional optical signal so as to slightly vary the wavelength about the multiple of two, the optical interferometer being responsive to the additional and original optical signals and a path length adjustment drive signal and being operative to develop a first interference pattern when the optical path length is a prescribed value and being operative to develop a second interference pattern when the optical path length is changed to develop an output signal at the additional wavelength, detector means responsive to the optical interference pattern and being operative to develop an electronic feedback signal when the first interference pattern is not present, and a feedback loop that responds to the dithering signal and the electronic feedback signal and produces the optical path length adjustment drive signal. The optical path length adjustment drive signal serves to tune the optical path length until it reaches the prescribed value, thereby producing the first interference pattern and stabilizing the optical interferometer for use by the original-wavelength light. Having utilized the additional dithered optical signal to stabilize and actively tune each optical interferometer, the digital conversion process can be performed using the same optical interferometers and the optical signal that varies in wavelength in accordance with the amplitude of the analog signal. Each interferometer generates two complementary output signals from this optical signal that varies in wavelength in accordance with the amplitude of the analog signal. A pair of detectors connected to each of the interferometers generates an electrical digital bit in response to the two complementary output signals wherein each of the digital bits are combined to form a parallel digital word. Each optical interferometer has an optical path length that provides the correct weighting factor to correspond to the particular digital bit in the digital word in accordance with the analog-to-digital conversion process described in U.S. patent application Ser. No. 09/089,844, filed Jun. 17, 1998, entitled "All Optical Analog-To-Digital Converter", and assigned to the same Assignee as the present invention.

In another aspect, the present invention provides a system having a plurality of optical interferometers for converting an analog optical signal into a parallel digital word and that uses an additional optical signal for tuning and stabilizing the plurality of optical interferometers by selecting the wavelength of the additional optical signal to be twice or one-half the wavelength of the original light detected.

The foregoing and additional features and advantages of this invention will become apparent from the detailed description and accompanying drawing figures below. In the figures and the written description, numerals indicate the various elements of the invention, like numerals referring to like elements throughout both the drawing figures and the written description.

DETAILED DESCRIPTION OF THE PREFERRED EMBODIMENTS

The present invention provides a fully optical analog-to-digital converter which is automatic and independent of iterative techniques, thus providing for an expedited conversion rate. As will be described in detail subsequently, the fully optical analog-to-digital converter initially converts an electrical analog signal, such as a signal in the radio frequency (RF) range, into an optical signal which varies in wavelength in accordance with the amplitude of the analog signal. The amplitude of the optical signal remains constant as the wavelength is varied over a range which corresponds to the analog amplitude of the analog signal. The wavelength variation on the optical signal is utilized to generate a corresponding parallel digital word. The fully optical analog-to-digital converter employs a plurality of optical interferometers that are tunable and stabilized using an additional optical signal that has a wavelength that differs by a factor of two from the average of the optical signal which varies in wavelength in accordance with the analog signal. The present invention will be described by first describing an embodiment of an improved stabilized optical interferometer used in the optical analog-to-digital converter.

Figure 1:
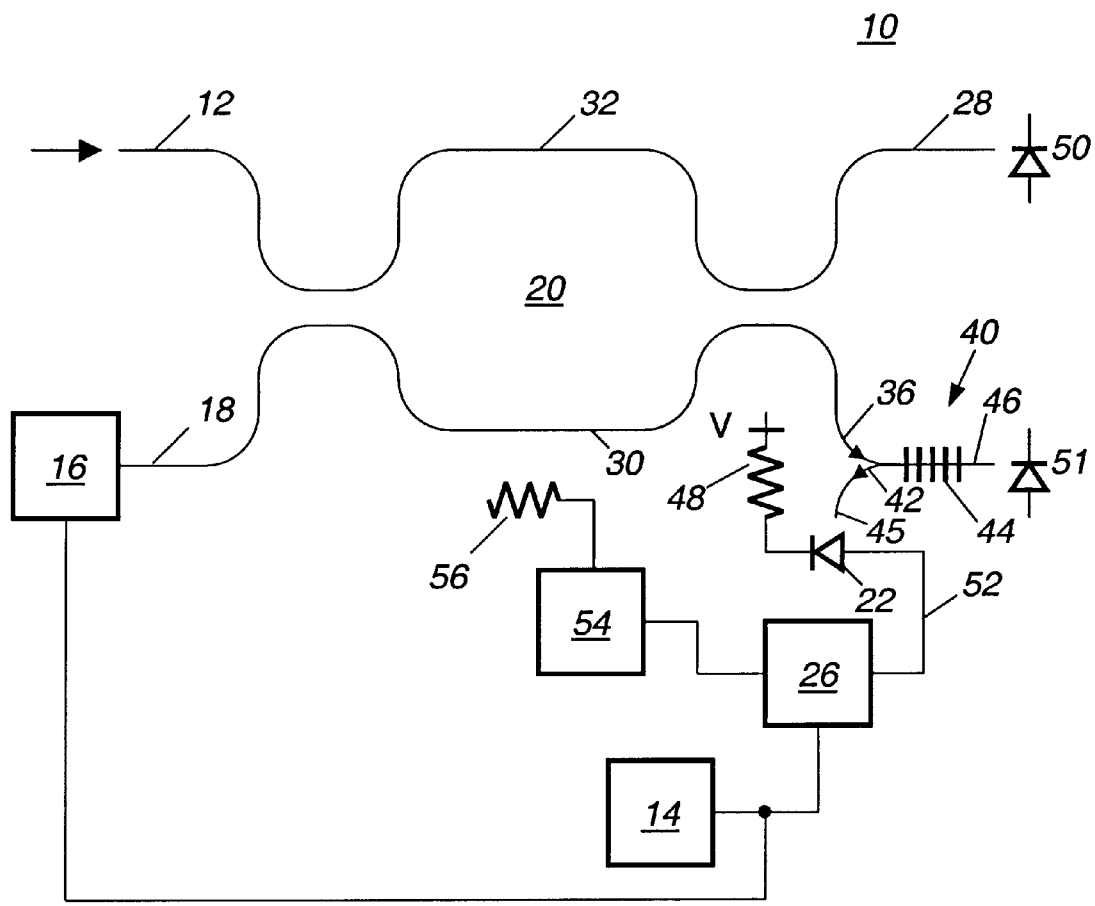
FIG. 1 is a block diagram of an apparatus for stabilizing an optical interferometer representing one embodiment of a stabilized optical interferometer used in the all optical analog to digital converter in accordance with the present invention.

As illustrated in the diagram of FIG. 1, an apparatus for stabilizing an optical interferometer, generally designated by the numeral 10 is shown. Briefly, the apparatus 10 employs an optical signal, such as the optical signal which varies in wavelength in accordance with the analog signal, that enters optical input 12, a dithering signal generator 14, a source 16 for a stabilizing optical signal, an optical interferometer 20 having optical outputs 28 and 36, a tuning leg 30, a wavelength demultiplexer 40 on output 36 with outputs 45 and 46, and output 45 feeding a photodetector 22 in a feedback circuit 24 that includes a synchronous detection lock-in amplifier 26 for supplying an electrical signal to buffer amplifier 54 that operates a tuning leg heater 56.

The optical signal entering input 12 preferably is provided by a laser diode that supplies an optical signal having a wavelength that varies on average about a value of 1.5 $\mu$m. This light has its wavelength vary a small amount around 1.5 $\mu$m in accordance with the amplitude of the analog signal that is to be extracted by the tuned interference state of the optical interferometer.

The dithering signal generator 14 is a conventional audio frequency electronic sine wave generator that is capable of providing an electronic dithering signal to both the optical source 16 and the synchronous detection lock-in amplifier 26 simultaneously. By providing the same dithering signal to optical source 16 and the lock-in amplifier it is possible to detect both the amplitude and the phase of a very small amplitude dithering signal in the presence of many other stronger signals.

The stabilizing optical signal source 16 generally comprises a laser diode that emits a beam of light that is stable in wavelength and is a multiple of a factor of two of the original light entering input 12. The wavelength of this signal is preferably 0.75 $\mu$m, which is a multiple of a factor of two, and more particularly, a multiple of one-half times the wavelength of the original optical signal entering input 12. This choice of wavelength is readily accommodated by available laser diodes since InGaAsP lasers emit at 1.5 $\mu$m and GaAlAs lasers emit at 0.75 $\mu$m. In response to current supplied by the dithering generator 14 on conductor 34, the laser diode 16 is driven with a current modulation that varies in accordance with the dithering signal. Because the wavelength of a laser diode depends on both the temperature, which is generated by resistive heating stemming from the drive current, and the carrier density within the lasing junction, which is directly taken from the drive current, the wavelength of the laser diode is a very sensitive function of the level of the drive current. Thus, the small modulation in the drive current from the addition of the dithering signal causes the wavelength of the laser diode to vary a small amount around 0.75 $\mu$m in accordance with the dithering signal. This provides the required means of delivering an optical signal on the input 18 comprising an optical fiber, which has a dithering wavelength that varies in accordance with the dithering signal about a value that is a factor of two different from the wavelength of the light entering input 12.

The optical interferometer 20 has two inputs 12 and 18, two optical legs or paths 30 and 32, and two output ports 28 and 36. It is preferably a Mach-Zehnder interferometer made of silica waveguide material as is commercially available from Photonic Integration Research, Inc., Columbus, Ohio, Model FDM-10G-1.5-M-PM. It includes an integrated thermal heater to enable tuning of its optical leg or path 30. However, the interferometer can be made using many materials including optical fiber, free space, or silica waveguide. The optical interferometer splits light into the two separate optical legs 30 and 32 and then recombines the light interferometrically to create optical outputs that can present constructive and destructive interference. The wavelength of light and the relative optical path lengths of the two legs 30 and 32 determine the particular state of interference that takes place when the light is combined. The state of interference determines if the output presents constructive interference, in which case there is an optical intensity output, or destructive interference, in which case there is an absence of optical intensity output. When one of the two optical path lengths within the interferometer is made to be adjustable, the state of interference can be continuously varied between the constructive and destructive interference states as long as the wavelength is held constant. This enables the optical interferometer to be set to a particular state for a given wavelength of light. When the wavelength is changed, the state of interference can be maintained by appropriately tuning the relative optical path length of the interferometer. Otherwise the state of interference will change as the wavelength is changed.

In this patent the phrase "optical path length" is characterized and mathematically defined as the product of the physical propagation distance and the associated refractive index of the medium through which the light propagates. It should be recognized that adjusting the optical path length can be accomplished by adjusting the physical propagation distance or adjusting the index of refraction of the medium through which the light propagates in the interferometer. The physical propagation distance can be adjusted by stretching a fiber with a piezoelectric transducer, thermally expanding the length with heat, or positioning a mirror within the interferometer via a piezoelectric piston. Adjusting the index of refraction could be accomplished by heating the medium or by an electro optic affect created via an applied electric field. In the preferred embodiment, the optical path length is changed by applying heat to thermally expand the segment of silica optical waveguide comprising leg 30 of the optical interferometer. Thermal heating can be used to perform the optical path length tuning in this invention despite the relatively long thermal time constants associated with this approach because only slow tuning adjustments are needed and dithering of the optical path is not required.

This apparatus utilizes the particular optical interference case where the optical path lengths are not changed when the wavelength is changed. Starting with an interference state where constructive interference occurs at one output port and destructive interference occurs at the other output port of the interferometer, a slight change in the wavelength is produced by the optical source 16, in this case by the dithering signal, where there is no immediate adjustment made to the optical path lengths in the interferometer within a time scale on the order of the dithering signal frequency. The destructive interference output occurs on output 36 where there is a demultiplexer 40 that will direct the light from optical source 16 to output 45, in a manner that will be described later, so that this light is directed to the photodetector or photodiode 22 for this example. This slight wavelength change in optical source 16 causes an increase in optical intensity every time the wavelength is pulled slightly from the preselected destructive interference pattern state. In the course of one sinusoidal dithering signal swing, the wavelength is slightly too short for half the cycle and slightly too long for the other half of the cycle. This leads to two cycles of increased intensity in the optical intensity of the destructive interference output directed to photodetector 22 for every complete cycle of dithering signal.

The electronic feedback circuit 24 comprises the photodetector 22 and a biasing resistor 48 coupled to a positive DC supply voltage V. The anode of the photodiode 22 is electrically connected via conductor 52 to the lock-in amplifier 26.

The synchronous detection lock-in amplifier 26 is available commercially from several manufacturers, such as Stanford Research Systems, Inc. in Sunnyvale Calif. The amplifiers synchronously detects a small electronic signal, complete with phase detection, by using a reference signal having the same frequency and delivers a steady state output voltage with a value corresponding to the amplitude swing of the detected signal and a voltage polarity that reflects the phase of the detected signal in relation to the original reference signal. The output voltage delivered by the commercial amplifiers is directly suitable as an electronic drive adjustment signal as will be subsequently described. This electronic drive adjustment voltage can be considered to be an error signal that indicates how far out-of-tune the optical interferometer is and the direction in which this error correction should be applied to return the optical interferometer to the preselected interference state.

As is well known, the photodetector generates a photocurrent in response to optical intensity. Hence, the electronic feedback signal in feedback circuit 24 generated by the photocurrent in photodetector 22 corresponds to a signal that varies with twice the frequency of the dithering signal. Thus the electronic feedback signal conveyed by the conductor 52 to the synchronous detection lock-in amplifier 26 comprises the second harmonic of the dithering frequency. This signal has twice the frequency of the dithering signal frequency. The synchronous lock-in amplifier 26 only amplifies signals that have the same frequency as the dithering signal frequency conveyed to it. Thus, the second harmonic contribution is not amplified by the amplifier 26. This is the normal properly tuned preselected interference state for the optical interferometer, and under these conditions there is no electronic drive adjustment signal generated to cause a correction in the stabilization or tuning of the optical interferometer.

When the interferometer is slightly out of tune, there will be a contribution of the fundamental component of the dithering signal frequency present in the electronic feedback signal that is detected by the lock-in amplifier 26.

An electronic optical path controller 54, preferably a buffer amplifier, translates the electronic drive adjustment signal to the appropriate drive signal necessary to electronically tune the optical path length of leg 30. In the embodiment where the optical interferometer 20 comprises a silica waveguide with an integrated heater, the voltage signal is converted to a current to drive a resistive heater element 56. In the embodiment where the optical interferometer uses an optical fiber and a PZT to stretch the fiber, an amplifier is employed to drive the PZT and create the necessary optical path length change to tune the optical interferometer.

It should be recognized that the stabilizing optical signal supplied through optical fiber 18 and the original optical signal having an average wavelength of 1.5 $\mu$m that enters through input 12 interfere independently within the optical interferometer 20. The interferometer is tuned so as to allow the wavelength varying optical signal at 1.5$\mu$m to interfere and deliver light out of the output ports 28 and 36, which for the case of output 36 the demultiplexer conveys to output 46. The stabilizing optical signal from source 16 that appears in output 36 is directed by the demultiplexer 40 to output 45 where it is detected by photodetector 22. The only aspect that is necessary is that interference, such as destructive interference as used in the example of the stabilizing optical signal occurs in the output port 36 so it can be directed by demultiplexer 40 to output 45. The state of interference delivered by the 1.5 $\mu$m light in output port 28 and output 46 can vary as the wavelength of this light is varied. The 1.5 $\mu$m light delivered by the two interferometer outputs 28 and 36, where the demultiplexer 40 delivers this light to output 46, is then detected by photodetectors 50 and 51 and used to determine the digital bit for the digital word. The photodetectors 50 and 51 are high speed photodetectors.

Still with reference to FIG. 1, the light in the output 36 is directed into the wavelength demultiplexer 40 which serves as a wavelength selective filter. This demultiplexer 40 comprises an optical circulator 42 and a retro reflector Bragg grating 44 characterized as having a period that is a first order diffractive retroreflector for 0.75 $\mu$m light. The Bragg grating 44 serves to pass the 1.5 $\mu$m light and to diffract just the 0.75 $\mu$m light back into the direction from which it came. More particularly, the Bragg grating 44 has a period that equals one-half times 0.75 $\mu$m divided by 1.46, which is the effective index of refraction of the fiber. This period of roughly 0.25 $\mu$m is half the size of the period needed to diffractively retroreflect 1.5 $\mu$m light, and will not effect the 1.5 $\mu$m light. Grating periods of this type can be made in optical fiber by holographic exposure using UV laser light as is known in the art. It is important that the length of this grating in the fiber is appropriate so that the retroreflection generally will occur equally for all the wavelengths about which the 0.75 $\mu$m source is dithered. Light delivered by the interferometer at 1.5 $\mu$m will pass through the circulator 42 and the Bragg grating 44 to the output 46 without retroreflection because the period of the Bragg grating is too small to diffract this light. The length of this path is made identical to that leading to the output 28 for recovery of the digital information. The light at a wavelength of 0.75 $\mu$m delivered by output 36 is also conveyed through the optical circulator 42, where it is retroreflected by diffraction from Bragg grating 44 and returned into the circulator. In a manner well known in the art, the circulator 42 directs this light via the Faraday rotation effect to its other output 45 which directs this light onto photodetector 22.

In operation, the source 16 provides light dithering about a wavelength of 0.75 $\mu$m that is used to stabilize the optical interferometer. Because it is selected to be a multiple of two (i.e. one-half is a multiple of two in that it is $2^{-1}$) of the 1.5 $\mu$m wavelength that enters input 12, the interference state established by the interferometer at a wavelength of 0.75 $\mu$m is the same as that established for the average wavelength of the 1.5 $\mu$m light that enters input 12. This operation requires the light entering input 12 to vary about a wavelength that on average remains stable with time so that the optical source 16 can be dithered about a stable fixed wavelength that is a multiple of two of the average of this light entering input 12. Moreover, the stabilizing source 16 enables the interferometer to be stabilized even though this light entering input 12 is varied in wavelength with the amplitude information of the analog signal that is to be converted to a digital signal.

The operation just described used, as an example, the destructive state of interference of the 0.75 $\mu$m light to output 36. The dither in the wavelength applied to the 0.75 $\mu$m light by dither generator 14 will generate the same frequency components in the output electrical signal of photodetector 22 as a function of interferometer 20 tuning as was previously described for the example for destructive interference in the case of constructive interference also. In the case of constructive interference, the slight wavelength change in the 0.75 $\mu$m light causes a decrease, as opposed to an increase, in the light intensity directed to the photodetector. Thus, for each cycle in the dithering signal, the wavelength changes slightly to cause two decreases in intensity, which again yields an intensity variation at twice the frequency of the dither frequency when the interferometer is properly tuned. Slightly out-of-tuned interferometer states will cause a contribution of the fundamental dither frequency in the electronic feedback signal that is detected by the lock-in amplifier in the same manner as previously described. Thus, the stabilizing optical signal can be used with either constructive or destructive interference in this invention.

In the embodiment shown in FIG. 1, it is convenient to use the constructive state of interference so that the dither signal at a wavelength of 0.75 $\mu$m is applied on its own independent interferometer input such that the 0.75 $\mu$m light is separated from the output 28 and thus directed to the output 36 where the demultiplexer 40 directs the light to output 45 and thus photodetector 22 receives the constructive interference. Hence, the light delivered by the 0.75 $\mu$m source is made to deliver constructive interference at the output 36. When the wavelength demultiplexer 40 directs this light to the photodetector 22, the photodetector 22 develops the photocurrent signal for use in the feedback circuit 24 for tuning and stabilizing the interferometer 20 in the manner described relative to the embodiment of FIG. 1. The outputs 28 and 46 deliver 1.5 $\mu$m light with an interference state that depends upon the particular characteristics of the 1.5 $\mu$m light. In this way, the wavelength demultiplexer 40 separates the interference patterns generated by the dithered optical source 16 from the complimentary outputs generated by the wavelength varying source delivered by input 12.

This structure enables the relative optical path length of an optical interferometer to be actively maintained, even when it is not possible to utilize the original light detected by the interferometer for stabilization because the wavelength of this light is varied and deliberately not held to a constant wavelength. Accordingly the unbalanced Mach-Zehnder interferometer is stabilized.

It is important that the optical path length of the two output ports 28 and 46 via the demultiplexer 40 on output 36 be identical in the all optical analog-to-digital converter. Since the outputs are complementary, there is light delivered in the one port exactly when there is no light delivered by the other port. If the optical path lengths in each output port are different, the two signals would be delivered at different times, thus degrading the digital signal determination. Thus, high speed photodetectors 50 and 51 must be used to detect the 1.5 $\mu$m optical signal. To gain access to output port 36 with photodetector 22 to detect the 0.75 $\mu$m stabilization optical signal, a special optical filter is used in output 36 that splits off the 0.75 $\mu$m light so it is directed to photodetector 22 without interrupting the output path required by the 1.5 $\mu$m light used to recover the digital path bit from the photodetectors 50 and 51 to create the digital word. This optical filter has the special property that it can split light that differs by a factor of two in wavelength. Most optical filters and wavelength division multiplexers will not separate light that differs in wavelength by a factor of two. An example of an optical filter that can separate light that differs in wavelength by a factor of two is a Bragg grating fiber filter used in retro reflective diffraction in conjunction with an optical circulator.

Figure 2:
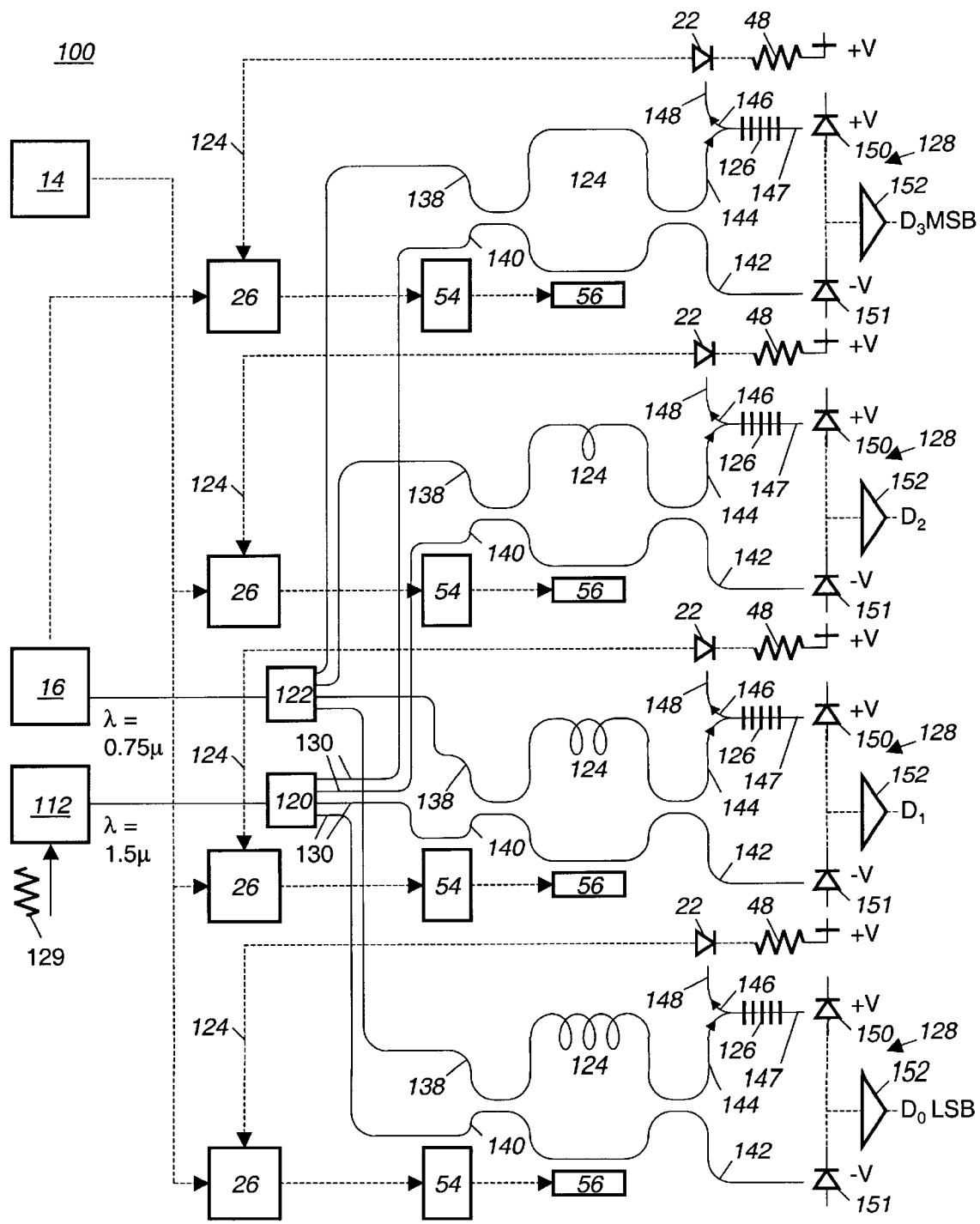
FIG. 2 is a block diagram of the all optical analog-to-digital converter using improved stabilized optical interferometers in accordance with the present invention.

With reference to FIG. 2 an all optical analog-to-digital converter system employing improved stabilized optical interferometers in accordance with the present invention is illustrated and generally designated by the numeral 100. The all optical analog-to-digital converter system is similar to the system disclosed in copending U.S. patent application Ser. No. 09/089,844, filed Jun. 17, 1998, entitled "All Optical Analog-To-Digital Converter", and assigned to the same Assignee as the present invention. As shown the system 100 comprises an analog signal amplitude to optical wavelength converter 112 for developing a first optical signal, a dithering generator 14, a source for a second optical signal 16 whose wavelength is a multiple of one-half of the wavelength (i.e. a multiple of two) of the wavelength of the optical signal developed by the converter 112, optical splitters 120 and 122, interferometers 124, feedback circuits 26, 54 and 56, wavelength division multiplexers 40, and an optoelectronic circuit 128.

Many of the parts of the system 100 are identical in construction to like parts in the apparatus 10 illustrated in FIG. 1 described above, and accordingly, there have been applied to each part of the system in FIG. 2 a reference numeral corresponding to the reference numeral that was applied to the like part of the apparatus described above and shown in FIG. 1. In FIG. 2 electrical wires or conductors are shown as dashed lines and optical fibers are shown as solid lines.

The fundamental difference between the apparatus 10 of FIG. 1 is that the system 100 stabilizing technique is applied to a plurality of optical interferometers and that the system is an all optical analog-to-digital converter that converts an analog signal into an optical signal that varies in wavelength in accordance with the input analog signal. It utilizes the wavelength variation to generate a corresponding parallel digital word.

In particular, the amplitude to optical wavelength converter serves to convert the analog signal 129 into an optical signal having a nominal 1.5 $\mu$m wavelength, but which varies in wavelength about the nominal wavelength in accordance with the amplitude of the analog signal. Typically, the analog signal is in the radio frequency (RF) range. The amplitude to optical wavelength converter preferably comprises a laser diode, although fiber lasers, optical fiber amplifiers, and other solid state amplifier system may be employed. Generally, a laser diode which is driven by a varying amplitude analog signal will deliver a longer output wavelength as the amplitude of the signal increases.

The wavelength varying optical signal generated by the converter is applied to the splitter 120 which splits the optical signal into a preselected number of light paths 130. Each path 130 is applied to a perspective leg 140 of the interferometer 124 and the interference state delivered by interferometers 124 is utilized to create the digital bits $D_0$, $D_1$, $D_2$ and $D_3$ in the final parallel digital word. The number of paths 130 is dependent on the desired level of resolution. For example, as illustrated in FIG. 2, for 4-bit resolution (16 signal levels), the wavelength varying optical signal is split into four light paths 130. The splitter 120 is preferably an active multimode signal splitter, such as the splitter disclosed in U.S. patent application Ser. No. 08/866,656, filed May 30, 1997, entitled "Active Multimode Optical Signal Splitter", and assigned to the same Assignee as the present invention. The splitter 120, in addition to splitting the optical signal, maintains an approximately equal intensity of each optical signal along each light path. Alternatively, the optical splitter could be a conventional splitter or a fiber optic star coupler comprising a group of optical fibers which have their cladding layer removed prior to being twisted together. This allows the light in one fiber to evanescently couple equally into all the other fibers, thereby allowing the wavelength varying optical signal to be split.

Referring still to FIG. 2, the two output signals from each interferometer present an optical intensity that varies in a complementary sinusoidal variation between the two outputs when the wavelength of the input light is varied such that when these outputs are applied to the optoelectronic circuit 128, and more particularly to the dual detectors 150 and 151, they are directly converted to an electronic digital bit. The dual detector is preferably a balanced detector including high speed photodiodes, although it should be recognized that the optoelectronic circuit may have other configurations. The circuit 128 also includes a limiting electronic amplifier 152. The limiting electronic amplifier 152 converts the signal to a digital "0" or "1" depending on the state of interference delivered by the interferometer which in turn depends on the wavelength.

When light is applied to photodiode 151, photocurrent proportional to the intensity of the light is conducted in a direction into the input of the limiting electronic amplifier. When light is applied to photodiode 150, photocurrent proportional to the intensity of the light is conducted in a direction out of the input of the limiting electronic amplifier. Thus, depending on which output is delivering greater light intensity and hence which photocurrent is greater, current either moves in or out of the input of the limiting amplifier. If current moves into the input, the limiting amplifier delivers a digital "one" bit, if it moves out of the input, the limiting amplifier delivers a digital "zero" bit. In this way, the state of optical interference established by the input wavelength creates a digital bit. Thus, for the entire first part of the complementary sinusoidal variation cycle, where more light is delivered from one of the two complementary ports, the electrical output corresponds to a "1". For the entire second portion of the cycle, where there is more light in the other complementary output, the output corresponds to a "0".

As an example of operation, consider a portion of an analog signal 129 where the amplitude ramps up from the minimum amplitude to the maximum amplitude. This particular analog signal is converted to an optical signal where the wavelength of light is swept through the range of wavelengths corresponding to the amplitude of the analog signal. As this light changes wavelength the output of each interferometer is a complementary sinusoidal variation in the intensity partitioned between the two output signals. The interferometer for the most significant bit (MSB) $D_3$ delivers just one cycle of variation in intensity. The interferometer for the next most significant bit $D_2$ experiences two complete cycles because the optical path length difference is made to be twice as large as that for the most significant bit. The next most significant bit $D_1$ experiences four cycles because the path length difference is four times as large, and finally the least significant bit $D_0$ (LSB) experiences eight cycles because the path length difference is eight times as large. It should be noted that the pattern in the optical length difference increases as a power of two for successively less significant digital bits. The most significant bit (MSB) will only go through one complementary sinusoidal cycle change for the entire analog amplitude domain. For 4-bit resolution, the least significant bit (LSB), the fourth bit, will go through eight complementary sinusoidal cycles of variation in intensity for the entire analog amplitude domain. Thus, the optical path length difference determines the weighting that specifies which digital bit in the digital word is generated.

A single stabilizing optical signal 16 is used that has a wavelength that is a multiple of two of the average value of wavelength varying signal created from the analog signal. In particular, this wavelength can be one-half of 1.5 µm or 0.75 µm. This stabilizing optical signal 16 is then dithered in wavelength a small amount about this multiple of two value by dither generator 14, just as in the embodiment of FIG. 1. This dithered stabilizing light is then optically split by the splitter 122 into a path for each optical interferometer 124 via the same means as was previously described to split the wavelength varying optical signal.

The optical interferometer 124 has two optical inputs 138 and 140 and two output ports 142 and 144. The stabilizing optical signal at a wavelength of 0.75 nm is supplied to the input 138 and the original optical signal having a wavelength that varies about 1.5 nm is applied to the second input 140. The optical interferometer is tuned so that the constructive interference of the 0.75 µm light takes place in the output 144 with the demultiplexer that utilizes the wavelength selective filter as previously described. The interference that occurs from the 1.5 µm light at the two outputs 142 and 144 reflects the information that will determine if the data bit is a zero or a one. In this invention the only aspect that is necessary is that the constructive interference of the stabilizing optical signal occurs in the output 144 and this is achieved by active stabilization through feedback of the detected 0.75 µm light.

The interferometers may be monolithic frequency division multiplexers (FDM) manufactured by Photonic Integration and Research, Inc. of Columbus, Ohio, under a typical model number like FDM-10G-1.5, which corresponds to an unbalanced interferometer that delivers one cycle of intensity variation when the light wavelength at 1.5 µm is changed by 0.08 nm (a frequency change of 10 GHz). Although the interferometers are illustrated in FIG. 2 as separate units, they may be configured monolithically on the same wafer. The interferometers may also be made from fiber optic cable and fiber optic couplers through the use of either polarization maintaining fiber or polarization controllers.

It is important that the interferometers 124 in this all optical analog to digital converter remain tuned to create the particular path differences. The particular path differences determines how the wavelength varying signal interferes and hence delivers more light in one output than the other which ultimately determines if the digital bits from the interferometers are a one or a zero. The invention serves to simultaneously stabilize all the optical interferometers in the all optical analog-to-digital converter.

A wavelength division demultiplexer that utilizes a fiber optic filter 126 is placed in one output of each interferometer. These filters utilize a Bragg grating with a period suited for retro reflecting, via optical diffraction, the 0.75 µm signals after the light has passed through one input of an optical circulator. This Bragg grating passes without diffractive retro reflection, the 1.5 µm optical signals to deliver this light at output ports 147. The 0.75 µm optical feedback signal is sent back into the optical circulator by the retro reflection form the Bragg grating and is delivered out the additional output ports 148 to the photodetectors 22. The feedback signals are sensed by the photodetectors 22 and they develop electronic is feedback signals that are used to individually adjust the optical path length of the leg 30 of each of the interferometers 124. The feedback circuit operates in the manner described with reference to FIG. 1.

In operation, the source 16 of light at a wavelength of 0.75 μm is used to develop the electronic feedback and hence the optical path length drive adjustment signal to stabilize the optical interferometer. Because it is selected to be a multiple of two (i.e. one-half the average wavelength from the 1.5 μm source 12, the interference state established by the interferometer is the same at that established for the average 1.5 μm wavelength. That is, there will be constructive interference in one leg and destructive interference in the other leg for both the average 1.5 μm wavelength and the stabilizing light source when the interferometer is properly tuned. In this invention, the stabilizing source 16 enables the interferometer to be stabilized even though the wavelength sensed by the interferometer is deliberately made to vary in accordance with the amplitude of the analog signal to be digitized.

Figure 3:
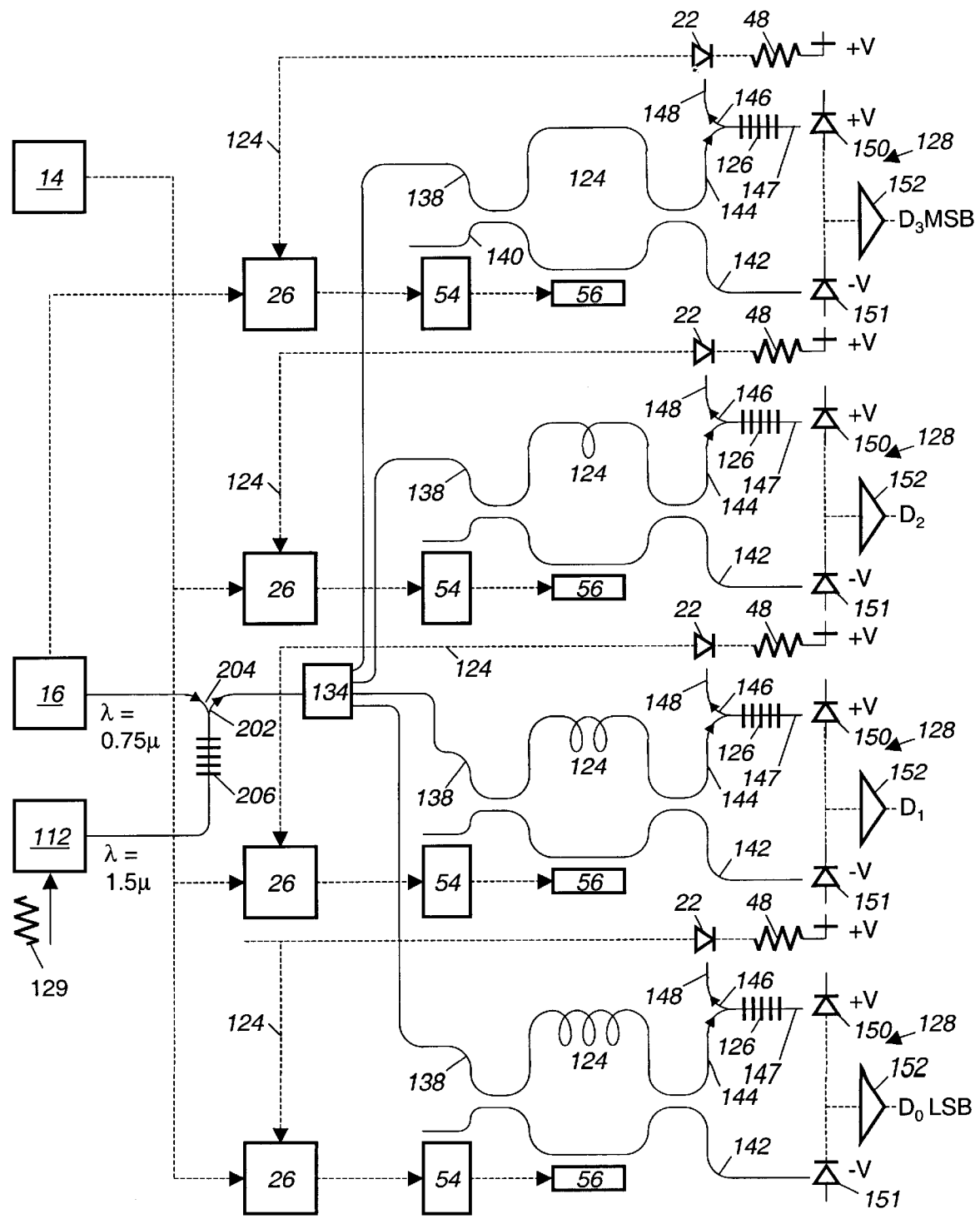
FIG. 3 is a block diagram of another embodiment of the all analog-to-digital converter with improved stabilized optical interferometers in accordance with the present invention.

In yet another embodiment, a system 200 for stabilizing optical interferometers in an all optical analog-to-digital converter made in accordance with the present invention is illustrated in FIG. 3. Many parts of the system 200 are identical in construction to like parts of the system 10 illustrated in FIG. 1 and the apparatus 100 illustrated in FIG. 2, and accordingly, there has been applied to each part of the system 200 a reference numeral corresponding to the reference numeral that was applied to the like part of the apparatus described above. In FIG. 3 electrical wires or conductors are shown as dashed lines and optical fibers are shown as solid lines.

The fundamental differences between the system and the apparatus illustrated in FIG. 2 is that the system includes wavelength division multiplexers in the input and output circuits, and like the embodiment of FIG. 2 is an all optical analog-to-digital converter that converts an analog signal into an optical signal that varies in wavelength in accordance with the analog input optical signal and uses the wavelength variation to generate a corresponding parallel digital word.

The wavelength division multiplexer 202 that combines the two optical signals again utilizes a circulator 204 and a Bragg grating retro reflector 206 to combine light signals that differ in wavelength by a factor of two. The light at 1.5 μm is passed by the grating retro reflector 206 which has a period set to retro reflect light with a wavelength of 0.75 μm. This period is the same as the period used in the grating 126 of the demultiplexers 146. The 1.5 μm light then passes into the circulator 204 and is delivered out to the input of the splitter 134. The 0.75 μm is sent into the other input of the circulator 204 where it is delivered into the Bragg grating retro reflector 206. When the 0.75 μm light enters the Bragg grating retro reflector 206, it becomes retro reflected back into the circulator 204 where it gets delivered along with the 1.5 μm light into the splitter 134.

This embodiment again uses a single wavelength dithered source 16 to provide the light for generating individual feedback signals that are used to stabilize each optical interferometer 124. The constructive interference of the stabilizing source can be made to occur in either output leg of the interferometers, but in the preferred embodiment constructive interference is made to occur in outputs 144 so that the wavelength demultiplexers 146 can deliver this stabilizing light to outputs 148. It should be recognized that these demultiplexers 146 can be placed in either outputs 142 or 144 since the optical interferometers 124 can be tuned to present constructive interference in either output.

It should also be recognized that additional wavelength demultiplexers identical in construction to 146, but not shown, can be placed in the other interferometer outputs 142 to act as filters to remove the small amount of 0.75 μm light that develops in the destructive interference output during the wavelength dither of the 0.75 μm optical stabilizing source 16. By removing this small amount of dithered light from the destructive interference output 142, the accurate determination of the digital bit from the interference state of the 1.5 μm light is further improved. The demultiplexer used in this application as a filter, will convey the 0.75 μm light to a separate unused output thereby removing it from the interferometer output 142 used for determining the digital bit. In a similar way, these demultiplexers can also be used as 0.75 μm light filters in the embodiment shown in FIG. 2 by placing additional demultiplexers in interferometer outputs 142.

In this embodiment, the optical splitter 134 that divides the light to each interferometer must act on both the 1.5 μm light and the 0.75 μm light simultaneously. This will preclude the use of a semiconductor active signal splitter since the wavelength spread of these two signals is too great to be accommodated by known semiconductor materials. Also, the stabilizing light and the wavelength varying light both enter the interferometer on the same input. The function is exactly as described relative to the embodiment in FIG. 2.

Obviously, many modifications and variations of the present invention are possible in view of the above teachings. Thus, it is to be understood that, within the scope of the appended claims, the invention may be practiced otherwise than as specifically described above.

Addendum

1. ANALOG-TO-DIGITAL CONVERTER EMPLOYING AN IMPROVED STABILIZED OPTICAL INTERFEROMETER

What is claimed is:

1. An apparatus for converting an analog signal into a digital signal, comprising:

a converter which converts said analog signal into a first optical signal which has a first wavelength that varies in accordance with an amplitude of said analog signal;

means for generating a dithering signal;

means for generating a second optical signal having a second wavelength that differs from the average of said first wavelength by a factor of two;

means applying a portion of said dithering signal to said second optical signal so as to provide said optical signal with a dithering wavelength;

means forming a preselected number of light paths each carrying said first and said second optical signals;

a plurality of interferometers connected to a respective one of said light paths for generating a first set of two complementary output signals from said first optical signal, each said optical interferometer being responsive to said second optical signals and a path length adjustment drive signal and being operative to develop a first interference pattern when said optical path length is a prescribed value and being operative to develop a second interference pattern when said optical path length is changed;

a first plurality of detector means responsive to said first set of complementary output signals and being operative to generate a digital bit in response to said two complementary output signals, wherein said digital bits are combined to form a parallel word;

a second plurality of detector means responsive to said first and said second optical interference patterns and each being operative to develop an electronic feedback signal when said first interference pattern is not present; and a plurality of means responsive to a portion of said dithering signal and a respective one of said electronic feedback signal and operative to produce one of said optical path length adjustment drive signals, said optical path length adjustment drive signal serving to change the optical path length of its associated interferometer until it reaches said prescribed value, thereby producing said first interference pattern and tuning said associated optical interferometer.

2. The apparatus as set forth in claim 1, wherein said plurality of optical interferometers generate said first and said second interference patterns from said second optical signal, and further comprising means for separating said first set of complementary output signals from said interference patterns.

3. The apparatus as set forth in claim 1, wherein said optical interferometer is of the Mach-Zehnder type.

4. The apparatus as set forth in claim 3, wherein said plurality of optical interferometers comprise silica waveguides and wherein said plurality of means responsive to a portion of said dithering signal comprises a heater for producing said optical path length adjustment drive signal.

5. The apparatus as set forth in claim 1, wherein the means responsive to said electronic feedback signal comprises a Synchronous detection lock-in amplifier means and a heater, said amplifier means responding to said dithered signal and said electronic feedback signal and serving to change the temperature of, and hence adjust the optical path length.

6. The apparatus as set forth in claim 1, and further comprising means for varying the wavelength of said first optical signal in accordance with the amplitude of said analog signal.

7. The apparatus as set forth in claim 1, and further comprising means for generating the second optical signal with a wavelength that is a factor of two different from the wavelength of said first optical signal.

8. The apparatus as set forth in claim 1, and further comprising means for dithering the wavelengths of said second optical signal in accordance with said means for generating a dithering signal.

9. The apparatus as set forth in claim 1, and further comprising means for generating the first optical signal having a first wavelength.

10. The apparatus as set forth in claim 1, wherein said means responsive to a portion of said dithering signal and said electronic feedback signal comprises a photodetector.

11. The apparatus as set forth in claim 1, wherein the optical path lengths of said plurality of interferometers differs by a factor of two, such weighting serving to connect the analog signal into a plurality of digital bits.

12. The apparatus as set forth in claim 1, wherein said plurality of interferometers each includes a circulator and a Bragg retro reflection grating arranged to form a wavelength division demultiplexer for separating light in said light paths differing in wavelength by a factor of two.

13. The apparatus as set forth in claim 1, wherein said means forming a preselected number of light paths includes a plurality of circulars and a Bragg retro reflection gratings for combining wavelengths of light that differ by a factor of two.

14. The apparatus as set forth in claim 1, wherein said means for generating a second optical signal comprises a laser diode and further comprising means for modulating the wavelength of said second optical signal.

15. The apparatus as set forth in claim 1, wherein said means forming a preselected number of light paths comprises a first optical splitter, a circulator and a Bragg retro reflection grating.

16. The apparatus as set forth in claim 1, wherein said means forming a preselected number of light paths comprises a first and second optical splitter.

* * * * *